(12) United States Patent
Chen et al.

(10) Patent No.: US 12,616,064 B2
(45) Date of Patent: Apr. 28, 2026

(54) THREE-DIMENSIONAL FAN-OUT INTEGRATED PACKAGE STRUCTURE, PACKAGING METHOD THEREOF, AND WIRELESS HEADSET

(71) Applicant: SJ Semiconductor (Jiangyin) Corporation, Jiangyin City (CN)

(72) Inventors: Yenheng Chen, Jiangyin City (CN); Chengchung Lin, Jiangyin City (CN)

(73) Assignee: SJ Semiconductor(Jiangyin) Corporation, Jiangyin City (CN)

( * ) Notice: Subject to any disclaimer, the term of this patent is extended or adjusted under 35 U.S.C. 154(b) by 650 days.

(21) Appl. No.: 17/989,224

(22) Filed: Nov. 17, 2022

(65) Prior Publication Data

US 2023/0163114 A1 May 25, 2023

(30) Foreign Application Priority Data

Nov. 19, 2021 (CN) .......................... 202111373008.9

(51) Int. Cl.
*H01L 25/16* (2023.01)
*H01L 21/48* (2006.01)
(Continued)

(52) U.S. Cl.
CPC ........ *H01L 25/165* (2013.01); *H01L 21/4853* (2013.01); *H01L 21/486* (2013.01);
(Continued)

(58) Field of Classification Search
CPC . H01L 25/165; H01L 25/162; H01L 25/0652; H01L 25/03; H01L 25/18;
(Continued)

(56) References Cited

U.S. PATENT DOCUMENTS

2017/0084589 A1* 3/2017 Kuo .................... H01L 23/3128
2018/0138116 A1* 5/2018 Lin ................... H01L 23/49816
(Continued)

*Primary Examiner* — Marlon T Fletcher
*Assistant Examiner* — Christina A Sylvia
(74) *Attorney, Agent, or Firm* — IPRTOP LLC

(57) ABSTRACT

A three-dimensional fan-out integrated package structure, a packaging method thereof, and a wireless headset are disclosed. The three-dimensional fan-out integrated package structure includes a first rewiring layer, a second rewiring layer, a metal connection pillar, a first semiconductor chip, a second semiconductor chip, a first filler layer, a first encapsulating layer, a functional chip, a second filler layer, a second encapsulating layer, and metal bumps. By stacking two semiconductor chips, the structure can effectively reduce the packaging area and realize device packaging with high density and high integration, while enabling the minimum line width/line spacing to be reduced to 1.5 μm/1.5 μm. In addition, the three-dimensional fan-out integrated package structure can simultaneously integrate various functional chips and components such as GPU/PMU/DDR/mm-wave antenna/capacitor/inductor/transistor/flash memory/ filter to realize system-level packaging, which not only can reduce cost but also improve the effectiveness of the package structure by using physical isolation to reduce device interference.

3 Claims, 8 Drawing Sheets

(51) Int. Cl.

| | |
|---|---|
| *H01L 21/56* | (2006.01) |
| *H01L 23/00* | (2006.01) |
| *H01L 23/14* | (2006.01) |
| *H01L 23/29* | (2006.01) |
| *H01L 23/31* | (2006.01) |
| *H01L 23/498* | (2006.01) |
| *H01L 23/66* | (2006.01) |
| *H04R 1/10* | (2006.01) |
| *H04R 3/00* | (2006.01) |

(52) U.S. Cl.
CPC .......... *H01L 21/565* (2013.01); *H01L 21/568* (2013.01); *H01L 23/145* (2013.01); *H01L 23/293* (2013.01); *H01L 23/3128* (2013.01); *H01L 23/3135* (2013.01); *H01L 23/49816* (2013.01); *H01L 23/49833* (2013.01); *H01L 23/49838* (2013.01); *H01L 23/49866* (2013.01); *H01L 23/66* (2013.01); *H01L 24/05* (2013.01); *H01L 24/08* (2013.01); *H01L 24/16* (2013.01); *H01L 24/32* (2013.01); *H01L 24/73* (2013.01); *H01L 25/162* (2013.01); *H04R 1/1091* (2013.01); *H04R 3/00* (2013.01); *H01L 2223/6616* (2013.01); *H01L 2223/6672* (2013.01); *H01L 2223/6677* (2013.01); *H01L 2224/05691* (2013.01); *H01L 2224/08145* (2013.01); *H01L 2224/16057* (2013.01); *H01L 2224/16235* (2013.01); *H01L 2224/32225* (2013.01); *H01L 2224/73204* (2013.01); *H01L 2924/1421* (2013.01); *H01L 2924/1432* (2013.01); *H01L 2924/14361* (2013.01); *H01L 2924/1438* (2013.01); *H04R 2420/07* (2013.01)

(58) Field of Classification Search
CPC ..... H01L 25/50; H01L 25/16; H01L 21/4853; H01L 21/486; H01L 21/565; H01L 21/568; H01L 21/6835; H01L 21/56; H01L 23/145; H01L 23/293; H01L 23/3128; H01L 23/3135; H01L 23/49816; H01L 23/49833; H01L 23/49838; H01L 23/49866; H01L 23/66; H01L 23/5389; H01L 24/05; H01L 24/08; H01L 24/16; H01L 24/32; H01L 24/73; H01L 24/24; H01L 24/82; H01L 24/92; H01L 24/02; H01L 24/11; H01L 24/13; H01L 2223/6616; H01L 2223/6672; H01L 2223/6677; H01L 2224/05691; H01L 2224/08145; H01L 2224/16057; H01L 2224/16235; H01L 2224/32225; H01L 2224/73204; H01L 2224/2331; H01L 2224/02333; H01L 2224/02373; H01L 2224/02379; H01L 2224/02381; H01L 2224/111; H01L 2224/13008; H01L 2224/13016; H01L 2924/1421; H01L 2924/1432; H01L 2924/14361; H01L 2924/1438; H01L 2221/68345; H01L 2221/68359; H01L 2221/68368; H01L 2225/06513; H01L 2225/06517; H01L 2225/06548; H01L 2225/06572; H01L 2225/06586; H04R 1/1091; H04R 3/00; H04R 2420/07

See application file for complete search history.

(56) References Cited

U.S. PATENT DOCUMENTS

| | | | | |
|---|---|---|---|---|
| 2019/0123020 A1* | 4/2019 | Yu | ..................... | H01L 23/3675 |
| 2020/0185330 A1* | 6/2020 | Yu | ......................... | H01L 24/24 |

* cited by examiner

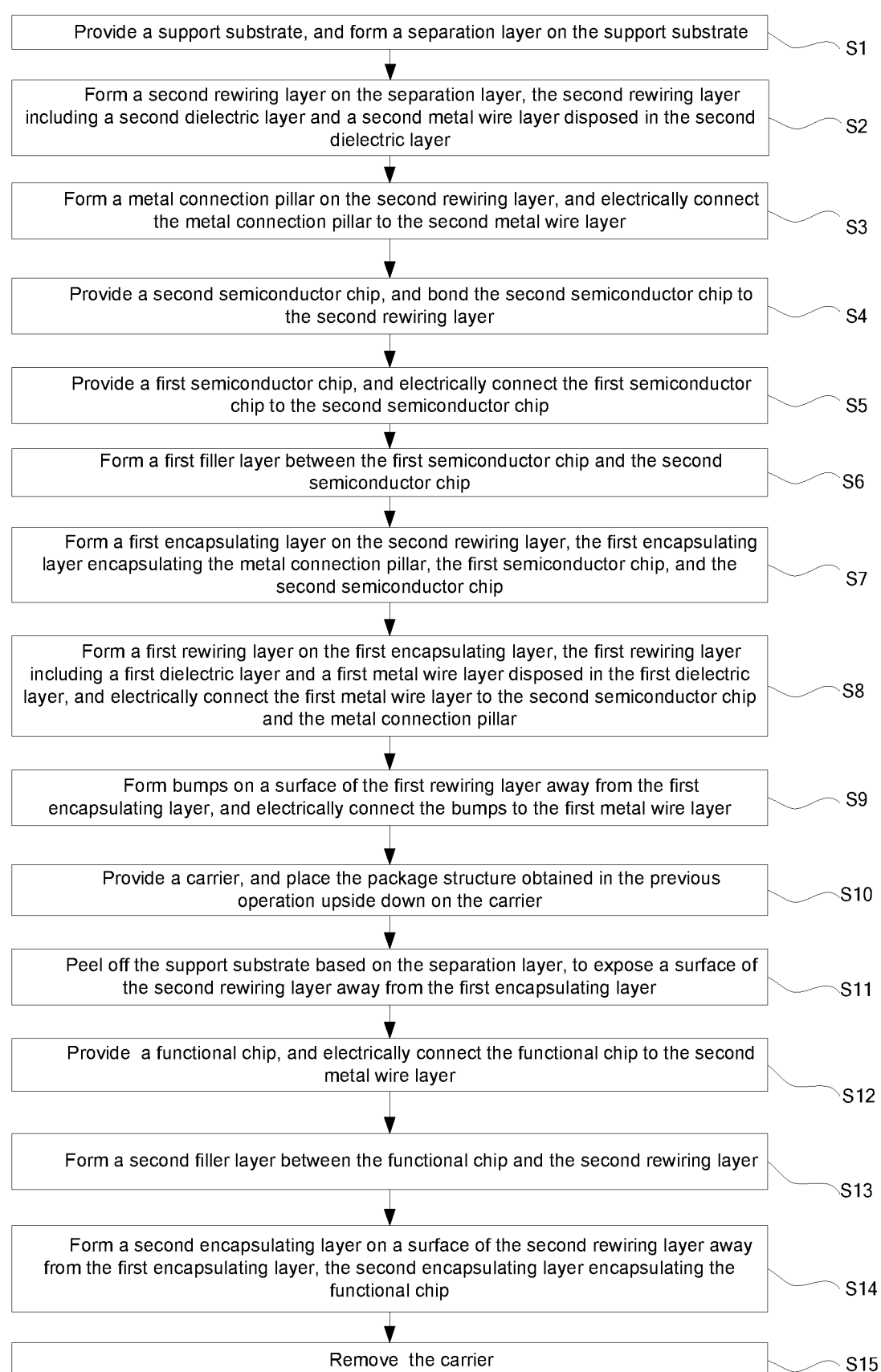

Provide a support substrate, and form a separation layer on the support substrate — S1

Form a second rewiring layer on the separation layer, the second rewiring layer including a second dielectric layer and a second metal wire layer disposed in the second dielectric layer — S2

Form a metal connection pillar on the second rewiring layer, and electrically connect the metal connection pillar to the second metal wire layer — S3

Provide a second semiconductor chip, and bond the second semiconductor chip to the second rewiring layer — S4

Provide a first semiconductor chip, and electrically connect the first semiconductor chip to the second semiconductor chip — S5

Form a first filler layer between the first semiconductor chip and the second semiconductor chip — S6

Form a first encapsulating layer on the second rewiring layer, the first encapsulating layer encapsulating the metal connection pillar, the first semiconductor chip, and the second semiconductor chip — S7

Form a first rewiring layer on the first encapsulating layer, the first rewiring layer including a first dielectric layer and a first metal wire layer disposed in the first dielectric layer, and electrically connect the first metal wire layer to the second semiconductor chip and the metal connection pillar — S8

Form bumps on a surface of the first rewiring layer away from the first encapsulating layer, and electrically connect the bumps to the first metal wire layer — S9

Provide a carrier, and place the package structure obtained in the previous operation upside down on the carrier — S10

Peel off the support substrate based on the separation layer, to expose a surface of the second rewiring layer away from the first encapsulating layer — S11

Provide a functional chip, and electrically connect the functional chip to the second metal wire layer — S12

Form a second filler layer between the functional chip and the second rewiring layer — S13

Form a second encapsulating layer on a surface of the second rewiring layer away from the first encapsulating layer, the second encapsulating layer encapsulating the functional chip — S14

Remove the carrier — S15

FIG. 2

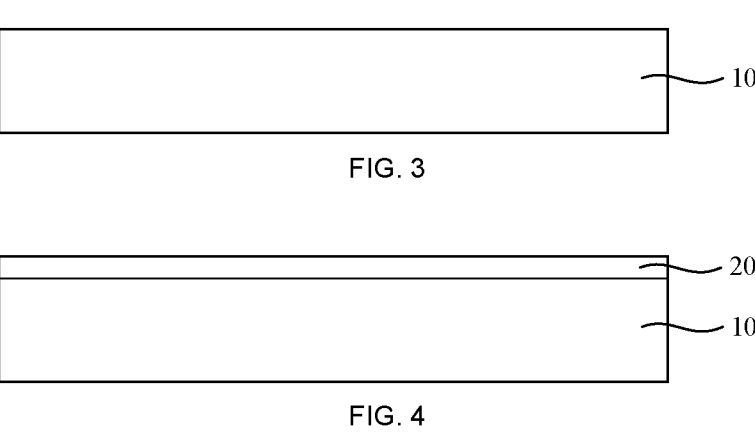
FIG. 3
FIG. 4
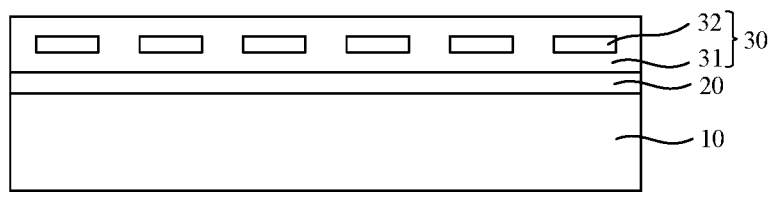
FIG. 5
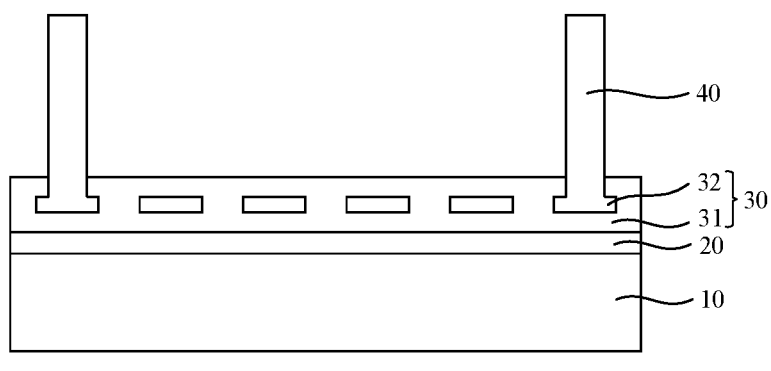
FIG. 6
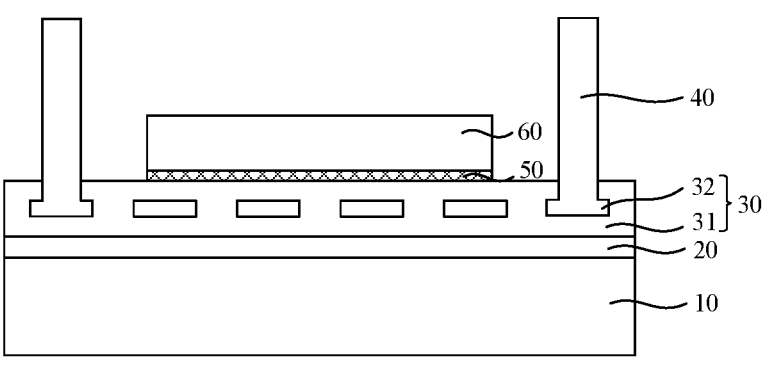
FIG. 7

THREE-DIMENSIONAL FAN-OUT INTEGRATED PACKAGE STRUCTURE, PACKAGING METHOD THEREOF, AND WIRELESS HEADSET

CROSS REFERENCE TO RELATED APPLICATION

The present application claims the benefit of priority to Chinese Patent Application No. CN 202111373008.9, entitled "THREE-DIMENSIONAL FAN-OUT INTE-GRATED PACKAGE STRUCTURE, PACKAGING METHOD THEREOF, AND WIRELESS HEADSET", filed with CNIPA on Nov. 19, 2021, the disclosure of which is incorporated herein by reference in its entirety.

FIELD OF TECHNOLOGY

The present disclosure relates to the field of semiconductor packaging technology, and in particular, to a three-dimensional fan-out integrated package structure, a packaging method thereof, and a wireless headset.

BACKGROUND

With the development of electronic devices towards miniaturization and multi-function, the varieties and numbers of chips that need to be integrated and packaged together are increasing, so the requirements for packaging structures and packaging processes are gradually more demanding. Currently, fan-out packaging processes are widely used in IC semiconductor packaging. The various chips and the passive devices are integrated by stacking them together up along the height direction. To form powerful systems that are small in size and low in power consumption has become a major challenge in the field of advanced semiconductor packaging.

As electronic hardware continues to evolve, the cost and performance advantages of past products face development bottlenecks. Advanced semiconductor packaging technologies can increase not only functionality and enhance product value, but also reduce costs effectively, so a series of advanced packaging technologies such as chip-level packaging (CSP), wafer-level packaging (WLP), and system-level packaging (SiP) have emerged. Compared with other packaging technologies, the most important feature of system-level packaging technology is its ability to meet the requirements of complex heterogeneous integration, i.e., integrating various active and optional passive devices with very different performances into a single standard package to form a system or subsystem. The Apple company introduced system-level package technology starting with the recently released Airpod Pro, which has helped boost the performance of headsets, seemed a worthwhile investment. Moreover, the space saved is used to introduce more incremental features, such as the active-noise-cancellation (ANC) features, to cultivate consumer stickiness. Another product Apple Watch, for example, integrates about 1,000 active and passive devices within a square with side lengths of only 25-30 mm each. Therefore, system-level packaging technology will be a major trend in the future. However, the current system-level packaging technology still suffers from the defects of large package area, low conformability, and low integration, and cannot meet the demand for ultra-high-density component packaging.

SUMMARY

The present disclosure provides a three-dimensional fan-out integrated package structure, a packaging method thereof, and a wireless headset.

The present disclosure provides a three-dimensional fan-out integrated package structure, which includes:

a first semiconductor chip having a first and a second surface, and a second semiconductor chip having a second surface stacked on the first surface of the first semiconductor chip;

a first rewiring layer, configured to be on the second surface of the first semiconductor chip;

a second rewiring layer, configured to be on a first surface of the second semiconductor chip, the second rewiring layer and the first rewiring layer being parallel and located on opposite sides of the stacked first and second semiconductor chips; the first semiconductor chip is electrically connected to the second semiconductor chip, and the second semiconductor chip is electrically connected to the first rewiring layer;

a plurality of metal connection pillars, located between the first rewiring layer and the second rewiring layer at outsides of the stacked first and second semiconductor chips, and electrically connected to the first rewiring layer and the second rewiring layer at each end, respectively;

a first filler layer, filling gaps between the first surface of the first semiconductor chip and a second surface of the second semiconductor chip;

a first encapsulating layer, located between the first rewiring layer and the second rewiring layer, and encapsulating the plurality of metal connection pillars, the first semiconductor chip and the second semiconductor chip;

a plurality of functional chips, located on a surface of the second rewiring layer opposite from the stacked first and second semiconductor chips, the plurality of functional chips being electrically connected to the second rewiring layer;

a second filler layer, filling gaps between the plurality of functional chips, and gaps between the plurality of functional chips and the second rewiring layer;

a second encapsulating layer, located on a surface of the second rewiring layer away from the from the stacked first and second semiconductor chips, second encapsulating layer encapsulating the plurality of functional chips; and metal bumps, located on a surface of the first rewiring layer away from the stacked first and second semiconductor chips, the metal bumps being electrically connected to the first rewiring layer.

This present disclosure further provides a wireless headset, which includes the three-dimensional fan-out integrated package structure as mentioned above.

The present disclosure further provides a method for preparing a three-dimensional fan-out integrated packaging structure, including following operation steps:

providing a support substrate, and forming a separation layer on the support substrate;

forming a second rewiring layer on the separation layer, the second rewiring layer including a second dielectric layer and a second metal wire layer disposed in the second dielectric layer;

forming a plurality of metal connection pillars between the first rewiring layer and the second rewiring layer and at sides of the stacked first and second semiconductor chips, and electrically connected to the first rewiring layer and the second rewiring layer at each end, respectively;

providing a second semiconductor chip having a first and a second surface, and bonding the first surface of the second semiconductor chip to the second rewiring layer;

providing a first semiconductor chip having a first and a second surface, and the second surface of the second semiconductor chip is stacked on the first surface of the first semiconductor chip; and the first semiconductor chip is electrically connected to the second semiconductor chip;

forming a first filler layer in gaps between the first semiconductor chip and the second semiconductor chip;

forming a first encapsulating layer on the second rewiring layer, the first encapsulating layer encapsulating the plurality of metal connection pillars, the first semiconductor chip, and the second semiconductor chip;

forming a first rewiring layer on the first encapsulating layer, the first rewiring layer including a first dielectric layer and a first metal wire layer disposed in the first dielectric layer, and electrically connecting the first metal wire layer to the second semiconductor chip and the metal connection pillars; the second rewiring layer is configured to be on the first surface of the second semiconductor chip, and the second rewiring layer and the first rewiring layer are parallel and located on opposite sides of the stacked first and second semiconductor chips; the second semiconductor chip is electrically connected to the first rewiring layer;

forming metal bumps on a surface of the first rewiring layer away from the stacked first and second semiconductor chips, and electrically connecting the metal bumps to the first metal wire layer;

providing a carrier, and flipping the package structure upside down on the carrier;

peeling off the support substrate based on the separation layer, to expose a surface of the second rewiring layer away from the stacked first and second semiconductor chips;

providing a plurality of functional chips, and electrically connecting the plurality of functional chips to the second metal wire layer;

forming a second filler layer in gaps between the plurality of functional chips and the second rewiring layer;

forming a second encapsulating layer on a surface of the second rewiring layer away from the stacked first and second semiconductor chips, the second encapsulating layer encapsulating the plurality of functional chips; and removing the carrier.

BRIEF DESCRIPTION OF THE DRAWINGS

FIG. 2 shows a flow chart of the packaging method of the three-dimensional fan-out integrated package structure according to Embodiment 2 of the present disclosure.

FIGS. 3-18 show schematic structures of the three-dimensional fan-out integrated package structure presented in each operation step of the major steps of the packaging method according to Embodiment 2 of the present disclosure.

DESCRIPTION OF REFERENCE NUMERALS

Figure 1:
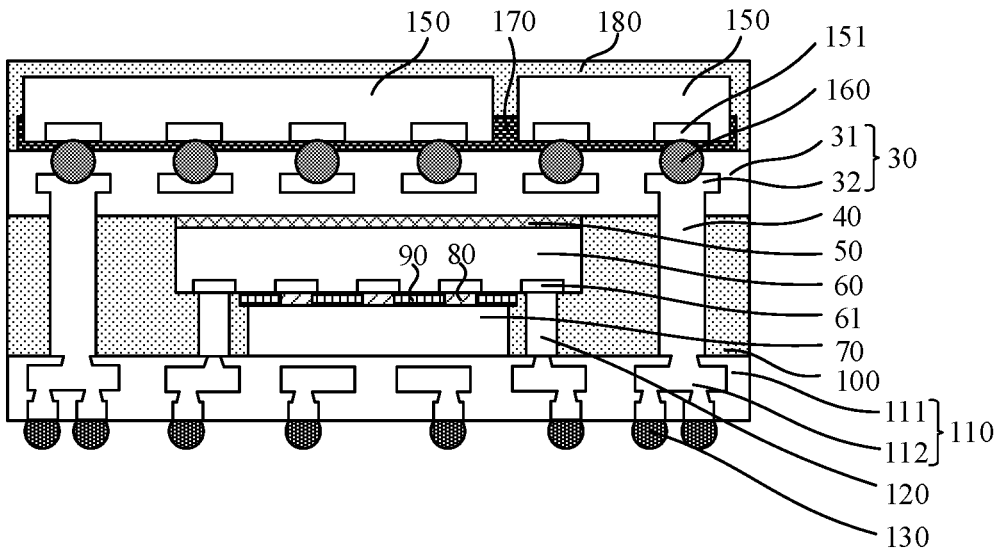
FIG. 1 shows a schematic structure of the three-dimensional fan-out integrated package structure according to Embodiment 1 of the present disclosure.

10 Support substrate
20 Separation layer

4

30 Second rewiring layer
31 Second dielectric layer
32 Second metal wire layer
40 Metal connection pillar
50 Adhesive layer
60 Second semiconductor chip
61 First bonding pad
70 First semiconductor chip
80 Metal conductive layer
90 First filler layer
100 First encapsulating layer
110 First rewiring layer
111 First dielectric layer
112 First metal wire layer
120 Metal column
130 Bump
140 Carrier
150 Functional chip
151 Second bonding pad
160 Solder connection structure
170 Second filler layer
180 Second encapsulating layer
S1~S15 Operation step steps

DETAILED DESCRIPTION

The embodiments of the present disclosure will be described below. Those skilled in the art can easily understand other advantages and effects of the present disclosure according to contents disclosed by the specification. The present disclosure may also be implemented or applied through other different specific implementation modes. Various modifications or changes may be made to all details in the specification based on different points of view and applications without departing from the spirit of the present disclosure.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number, positional relationship and scale of each component during actual implementation thereof may be freely changed, and the component layout configuration thereof may be more complicated.

Embodiment 1

The conventional three-dimensional fan-out package structure includes two semiconductor chips placed horizontally side by side inside the package structure, increasing the package's lateral area. The minimum line width/line spacing cannot be smaller than 20 μm/20 μm, which does not meet the current demand for the package structure with increasingly high integration levels. The present disclosure provides an improved solution to reduce the minimum line width/line spacing to 1.5 μm/1.5 μm, as described below.

As shown in FIG. 1, the present disclosure provides a three-dimensional fan-out integrated package structure, which includes a first rewiring layer 110, a second rewiring layer 30, a metal connection pillar 40, a first semiconductor chip 70, a second semiconductor chip 60, a first filler layer 90, a first encapsulating layer 100, a functional chip 150, a second filler layer 170, a second encapsulating layer 180, and metal bumps 130. The first rewiring layer 110 and the second rewiring layer 30 are provided in parallel; the metal connection pillar 40 is located between the first rewiring layer 110 and the second rewiring layer 30 and is electrically connected to the first rewiring layer 110 and the second rewiring layer 30 at its each end, respectively; the second semiconductor chip 60 is stacked on the first semiconductor chip 70, the first semiconductor chip 70 and the second semiconductor chip 60 being both located between the first rewiring layer 110 and the second rewiring layer 30, the first semiconductor chip 70 being electrically connected to the second semiconductor chip 60, and the second semiconductor chip 60 being also electrically connected to the first rewiring layer 110; the first filler layer 90 is filled between the first semiconductor chip 70 and the second semiconductor chip 60; the first encapsulating layer 100 is located between the first rewiring layer 110 and the second rewiring layer 30, and encapsulates the metal connection pillar 40, the first semiconductor chip 70 and the second semiconductor chip 60; the functional chips 150 are located on a surface of the second rewiring layer 30 away from the stacked first and second semiconductor chips, and is electrically connected to the second rewiring layer 30; the second filler layer 170 is filled between the functional chip 150 and the second rewiring layer 30; the second encapsulating layer 180 is located on a surface of the second rewiring layer 30 away from the first encapsulating layer 100, and encapsulates the functional chip 150; the metal bumps 130 are located on a surface of the first rewiring layer 110 away from the first encapsulating layer 100, and is electrically connected to the first rewiring layer 110. It is to be noted that the first rewiring layer 110 includes a first dielectric layer 111 and a first metal wire layer 112 disposed in the first dielectric layer 111, the first metal wire layer 112 being partially exposed on a surface of the first dielectric layer 111 for electrical connection; the second rewiring layer 30 includes a second dielectric layer 31 and a second metal wire layer 32 disposed in the second dielectric layer 31, the second metal wire layer 32 being partially exposed on a surface of the second dielectric layer 31 for electrical connection.

By way of example, the material of the first dielectric layer 111 includes, but is not limited to, one of or a combination of two or more of epoxy resin, silicon oxide, polyimide, and silica gel; the material of the second dielectric layer 31 includes, but is not limited to, one of or a combination of two or more of epoxy resin, silicon oxide, polyimide, and silica gel. The material of the first metal wire layer 112 includes, but is not limited to, one of or a combination of two or more of copper, nickel, gold, silver, aluminum, and titanium; the material of the second metal wire layer 32 includes, but is not limited to, one of or a combination of two or more of copper, nickel, gold, silver, aluminum, and titanium.

As an example, in the first rewiring layer 110, both the first dielectric layer 111 and the first metal wire layer 112 may be in a single-layer or multi-layer structure. The first dielectric layer 111 and the first metal wire layer 112 are alternately laminated, to ensure that different first metal wire layers 112 can be electrically connected to each other. The structure of the second rewiring layer 30 may be designed with reference to that of the first rewiring layer 110, which will not be repeated herein.

As an example, the material of the metal connection pillar 40 includes, but is not limited to, one of or a combination of two or more of gold, silver, copper, titanium, and aluminum. Preferably, the material of the metal connection pillar 40 is copper.

By way of example, the material of the first encapsulating layer 100 includes, but is not limited to, one of or a combination of two or more of epoxy resin, polyimide, and silica gel. The material of the second encapsulating layer 180 includes, but is not limited to, one of or a combination of two or more of epoxy resin, polyimide, and silica gel. The material of the first filler layer 90 includes, but is not limited to, one of or a combination of two or more of epoxy resin, polyimide, and silica gel. The material of the second filler layer 170 includes, but is not limited to, one of or a combination of two or more of epoxy resin, polyimide, and silica gel.

The first filler layer 90 forms a protective layer by filling the gap between the first semiconductor chip 70 and the second semiconductor chip 60, not only to avoid the influence of water vapor, oxygen, etc., but also to improve the bonding strength of the first semiconductor chip 70 and the second semiconductor chip 60. The second filler layer 170 is filled between the functional chip 150 and the second rewiring layer 30, and has the same function as the first filler layer 90, which will not be described herein.

By way of example, the metal bump 130 includes, but is not limited to, one of or a combination of two or more of copper bump, tin bump, aluminum bump, and nickel bump.

By way of example, the first semiconductor chip 70 may be a radio frequency chip (RF), and the second semiconductor chip 60 may be a microcontroller unit (MCU). The functional chip 150 may be a memory chip such as double-data-rate synchronous dynamic RAM (DDR) and flash memory, or may employ various devices such as graphics processing unit (GPU), power management unit (PMU), millimeter-wave antenna, transistor and filter. The present disclosure does not limit the form (unpacked chip or packaged chip), number and type of the first semiconductor chip 70, the second semiconductor chip 60 and the functional chip 150, which can be set according to actual needs.

As an example, the second semiconductor chip 60 includes a plurality of first bonding pads 61, part of the first bonding pads 61 being electrically connected to the first metal wire layer 112 through metal columns 120 located in the first encapsulating layer 100, and another part of the first bonding pads 61 being electrically connected to the first semiconductor chip 70 through a metal conductive layer 80 located in the first filler layer 90; the functional chips 150 include a plurality of second bonding pads 151, the second bonding pad 151 is formed with a solder connection structure 160, and the solder connection structure 160 is connected to the second metal wire layer 32. The material of the metal columns 120 and the metal conductive layer 80 includes, but is not limited to, one of or a combination of two or more of gold, silver, copper, titanium, and aluminum.

Specifically, the solder connection structure 160 includes a solder ball and a conductive pillar; one end of the conductive pillar is connected to the second bonding pad 151, and another end of the conductive pillar is connected to the solder ball; the solder ball is connected to the second metal wire layer 32. The solder connection structure 160 may also have only a solder ball, the solder ball being connected to the second bonding pad 151 and the second metal wire layer 32.

By way of example, an adhesive layer 50 is further provided between the second semiconductor chip 60 and the second rewiring layer 30. The adhesive layer 50 is used to secure the second semiconductor chip 60 and prevent the second semiconductor chip 60 from moving during use. The material of the adhesive layer 50 may be a tape with adhesive properties on both sides, adhesive glue, or other materials with adhesive properties.

By way of example, the three-dimensional fan-out integrated package structure further includes passive elements, the passive elements including but not limited to capacitors, resistors and inductors, the passive elements being located on a surface of the second rewiring layer 30 away from the first encapsulating layer 100 and electrically connected to the second metal wire layer 32.

This present disclosure further provides a wireless headset, which includes the three-dimensional fan-out integrated package structure.

Embodiment 2

As shown in FIG. 2, the present disclosure provides a method of preparing a three-dimensional fan-out integrated packaging structure. The preparation method is used to prepare the three-dimensional fan-out integrated package structure as mentioned in Embodiment 1, in which the packaging materials of the components and the beneficial effects achieved have been described, and will not be repeated in this below Embodiment. The method of preparing specifically includes the following operation steps.

As shown in FIGS. 2-4, operation step S1 is first carried out to provide a support substrate 10, and form a separation layer 20 on the support substrate 10.

As an example, as shown in FIG. 3, the support substrate 10 includes one of a glass substrate, a metal substrate, a semiconductor substrate, a polymer substrate, and a ceramic substrate. The support substrate 10 may be wafer-shaped, square panel-shaped, or in any other desired shape. This embodiment prevents the semiconductor chip from cracking, warping, fracturing, etc. during subsequent preparation by means of the support substrate 10.

Alternatively, as shown in FIG. 4, the separation layer 20 is selected from a tape layer or polymer layer, and the separation layer 20 is applied to a surface of the support substrate 10 by a spin coating process, and then the separation layer 20 is cured into shape using a laser curing, UV curing, or thermal curing process.

As shown in FIG. 2 and FIG. 5, operation step S2 is performed to form a second rewiring layer 30 on the separation layer 20, the second rewiring layer 30 including a second dielectric layer 31 and a second metal wire layer 32 disposed in the second dielectric layer 31.

A specific operation step of forming the second rewiring layer 30 includes: forming a second deposited dielectric layer using a chemical vapor deposition process or a physical vapor deposition process, and etching the second deposited dielectric layer to form a patterned second dielectric layer 31.

A second metal layer is formed on a surface of the second dielectric layer 31 by chemical vapor deposition process, physical vapor deposition process, evaporation plating process, sputtering process, electroplating process or chemical plating process, and the second metal layer is etched to form the second metal wire layer 32.

As shown in FIG. 2 and FIG. 6, operation step S3 is performed to form a metal connection pillar 40 on the second rewiring layer 30, and to electrically connect the metal connection pillar 40 to the second metal wire layer 32. The process for forming the metal connection pillar 40 may be selected from wire soldering, electroplating and chemical plating, or as desired, without limitation herein.

As shown in FIG. 2 and FIG. 7, operation step S4 is performed to provide a second semiconductor chip 60 and bond the second semiconductor chip 60 to the second rewiring layer 30. Specifically, the bonding may be achieved by an adhesive layer 50.

Figure 8:
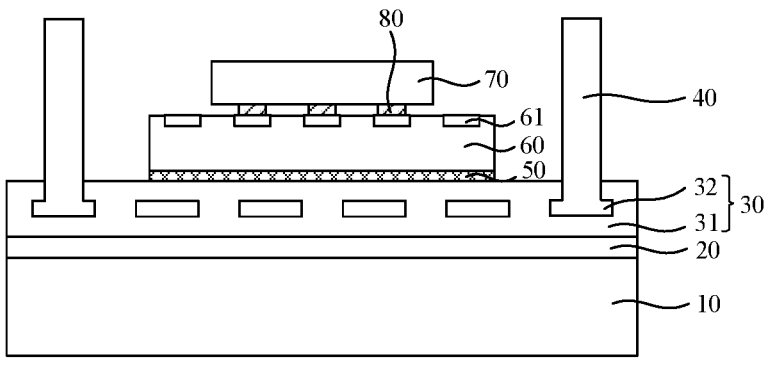

As shown in FIG. 2 and FIG. 8, operation step S5 is performed to provide a first semiconductor chip 70, stack the first semiconductor chip 70 on the second semiconductor chip 60, and electrically connect the first semiconductor chip 70 to the second semiconductor chip 60. Specifically, the second semiconductor chip 60 includes a plurality of first bonding pads 61, part of the first bonding pads 61 being electrically connected to the first semiconductor chip 70 through a metal conductive layer 80.

Figure 9:
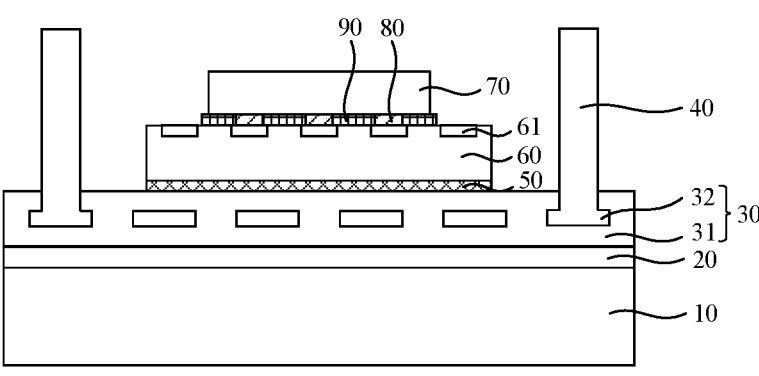

As shown in FIG. 2 and FIG. 9, operation step S6 is performed to form a first filler layer 90 between the first semiconductor chip 70 and the second semiconductor chip 60 such that the first filler layer 90 encapsulates the metal conductive layer 80.

Figure 10:
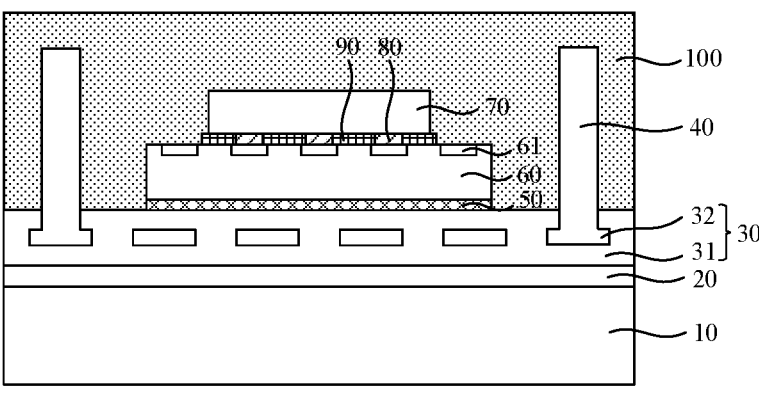

As shown in FIG. 2 and FIG. 10, operation step S7 is performed to form a first encapsulating layer 100 on the second rewiring layer 30. The first encapsulating layer 100 encapsulates the metal connection pillar 40, the first semiconductor chip 70, and the second semiconductor chip 60.

Figure 11:
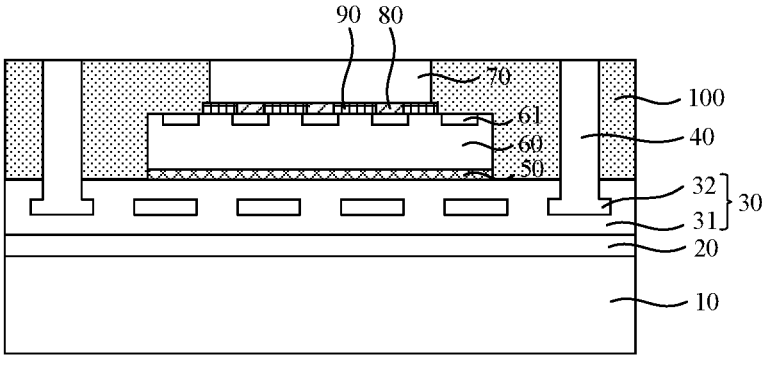

Specifically, the method of forming the first encapsulating layer 100 includes, but is not limited to, one of compression molding, transfer molding, liquid seal molding, vacuum lamination, and spin coating. Alternatively, as shown in FIG. 11, after forming the first encapsulating layer 100, a process of grinding or polishing may also be applied to the upper surface of the first encapsulating layer 100, to provide a flat first encapsulating layer 100 and to make the upper surface of the first encapsulating layer 100 flush with the upper surface of the metal connection pillar 40.

Figure 12:
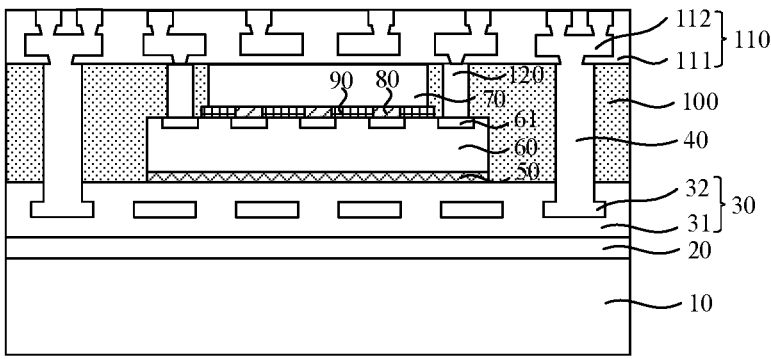

As shown in FIG. 2 and FIG. 12, operation step S8 is performed to form a first rewiring layer 110 on the first encapsulating layer 100, the first rewiring layer 110 including a first dielectric layer 111 and a first metal wire layer 112 disposed in the first dielectric layer 111, and to electrically connect the first metal wire layer 112 to the second semiconductor chip 60 and the metal connection pillar 40. The first metal wire layer 112 may be electrically connected to the first bonding pads 61 of the second semiconductor chip 60 through metal columns 120.

A specific operation step of forming the first rewiring layer 110 includes: forming a first deposited dielectric layer using a chemical vapor deposition process or a physical vapor deposition process, and etching the first deposited dielectric layer to form a patterned first dielectric layer 111.

A first metal layer is formed on a surface of the first dielectric layer 111 by a chemical vapor deposition process, a physical vapor deposition process, an evaporation plating process, a sputtering process, an electroplating process or a chemical plating process, and the first metal layer is etched to form the first metal wire layer 112.

Figure 13:
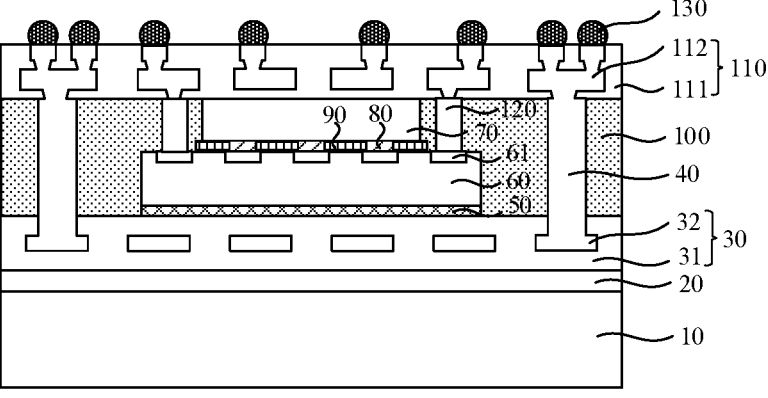

As shown in FIG. 2 and FIG. 13, operation step S9 is performed, including first etching the first rewiring layer 110 to expose the first metal wire layer 112 in the first rewiring layer 110, and then forming metal bumps 130 on a surface of the first rewiring layer 110 away from the first encapsulating layer 100, and electrically connecting the metal bumps 130 to the first metal wire layer 112.

Figure 14:
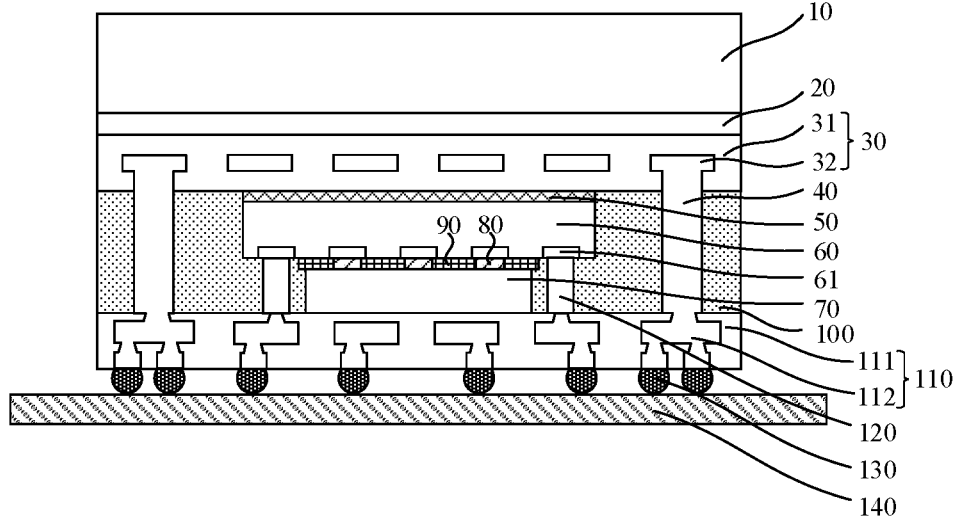

As shown in FIG. 2 and FIG. 14, operation step S10 is performed to provide a carrier 140, and the package structure obtained in the previous operation step is placed upside down on the carrier 140 (with the metal bumps 130 facing downward). As an example, the carrier 140 is selected from a glass substrate, a metal substrate, a semiconductor substrate, a polymer substrate, and a ceramic substrate.

Figure 15:
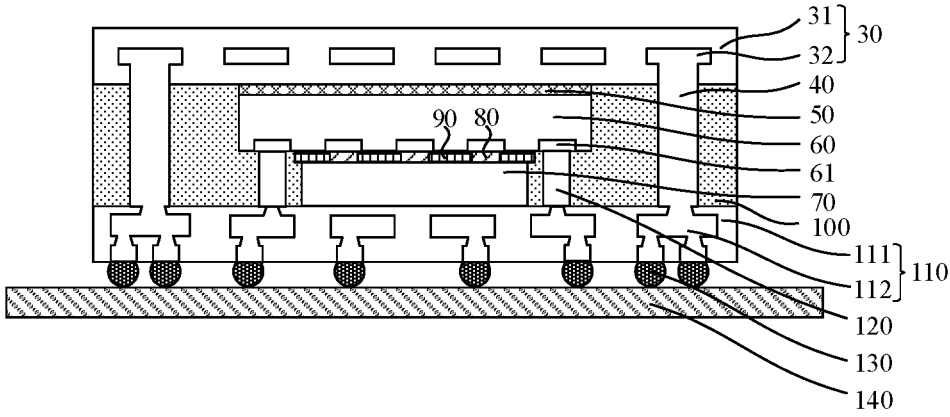

As shown in FIG. 2, FIG. 14 and FIG. 15, operation step S11 is performed to peel off the support substrate 10 based on the separation layer 20, which may be achieved by reducing the adhesion of the separation layer 20 using an exposure method, to expose a surface of the second rewiring layer 30 away from the first encapsulating layer 100.

Figures 16, 17:
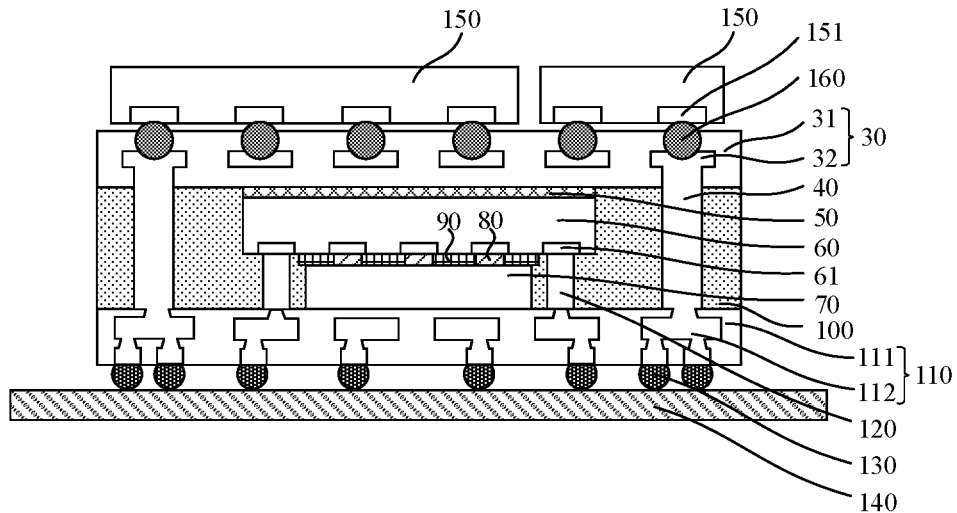

As shown in FIG. 2 and FIG. 16, operation step S12 is performed to provide functional chips 150, and to electrically connect the functional chips 150 to the second metal wire layer 32. Specifically, the functional chips 150 include a plurality of second bonding pads 151, the second bonding pad 151 is formed with a solder connection structure 160, and the functional chips 150 are electrically connected to the second metal wire layer 32 by the solder connection structure 160. Alternatively, passive components such as capacitors, resistors and inductors may be provided to be electrically connected to the second metal wire layer 32.

As shown in FIG. 2 and FIG. 17, operation step S13 is performed to form a second filler layer 170 to fill the gaps between the functional chips 150 and the second rewiring layer 30.

Figure 18:
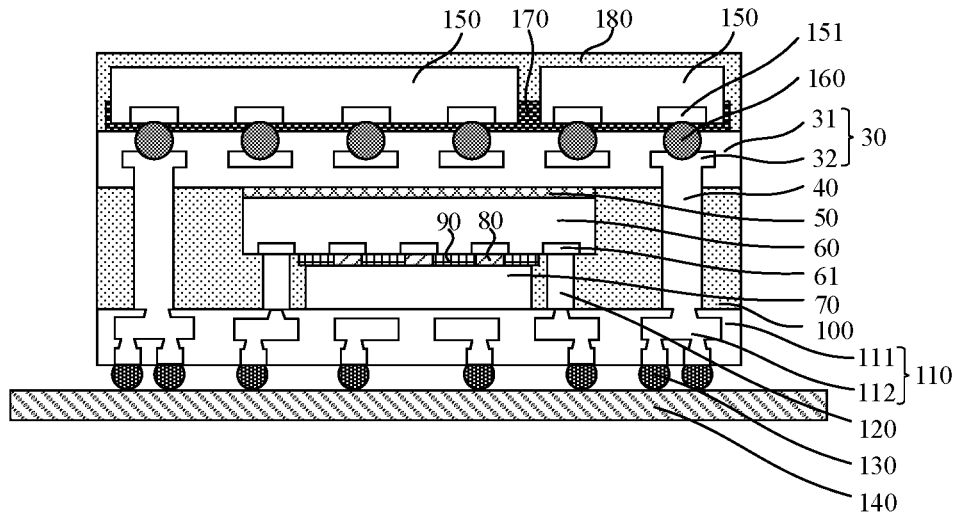

As shown in FIG. 2 and FIG. 18, operation step S14 is performed to form a second encapsulating layer 180 on a surface of the second rewiring layer 30 away from the first encapsulating layer 100, and the second encapsulating layer 180 encapsulates the functional chips 150. The specific method of forming the second encapsulating layer 180 can be referred to the method of forming the first encapsulating layer 100, which will not be repeated herein.

Operation step S15 is performed to remove the carrier to obtain the three-dimensional fan-out integrated package structure of the present disclosure as shown in FIG. 1.

In summary, the present disclosure provides a three-dimensional fan-out integrated package structure, a packaging method thereof, and a wireless headset. The three-dimensional fan-out integrated package structure is formed by stacking two semiconductor chips, which effectively reduces the packaging area and enables high-density and high-integration device packaging, while enabling the minimum line width/line spacing to be reduced to 1.5 µm/1.5 µm, much smaller than the 20 µm/20 µm of conventional substrates. In addition, the three-dimensional fan-out integrated package structure of the present disclosure can simultaneously integrate various functional chips and components such as GPU/PMU/DDR/mm-wave antenna/capacitor/inductor/transistor/flash memory/filter to realize system-level packaging, which not only can reduce cost but also improve the effectiveness of the package structure by using physical isolation to reduce device interference. Therefore, the present disclosure effectively overcomes various shortcomings in the existing technology and has high industrial utilization value.

The above-mentioned embodiments are merely illustrative of the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

What is claimed is:

1. A method for preparing a three-dimensional fan-out integrated packaging structure, comprising following operation steps:

providing a support substrate, and forming a separation layer on the support substrate;

forming a second rewiring layer on the separation layer, wherein the second rewiring layer comprises a second dielectric layer and a second metal wire layer disposed in the second dielectric layer, forming a plurality of metal connection pillars on the second rewiring layer and at sides of a first semiconductor chip and second semiconductor chip stacked together, and electrically connected to the second rewiring layer;

wherein the second semiconductor chip has a first surface and a second surface, and the second surface of the second semiconductor chip is bonded to the second rewiring layer, wherein the first semiconductor chip has a first surface and a second surface, wherein the second surface of the first semiconductor chip is stacked on the first surface of the second semiconductor chip with a metal conductive layer in between; and wherein the first semiconductor chip is electrically connected to the second semiconductor chip through the metal conductive layer;

forming a first filler layer in a gap in the metal conductive layer of the stack of the first semiconductor chip and the second semiconductor chip;

forming a first encapsulating layer on the second rewiring layer, wherein the first encapsulating layer encapsulates the plurality of metal connection pillars, the first semiconductor chip, and the second semiconductor chip;

forming a first rewiring layer on the first encapsulating layer, wherein the first rewiring layer comprises a first dielectric layer and a first metal wire layer disposed in the first dielectric layer, and electrically connecting the first metal wire layer to the second semiconductor chip and the plurality of metal connection pillars;

wherein the second rewiring layer is configured to be on the first surface of the second semiconductor chip, wherein the second rewiring layer and the first rewiring layer are parallel and located on opposite sides of the stacked first semiconductor chip and second semiconductor chip;

forming metal bumps on a surface of the first rewiring layer away from the stacked first semiconductor chip and second semiconductor chip, and electrically connecting the metal bumps to the first metal wire layer, providing a carrier, and flipping the three-dimensional fan-out integrated packaging structure upside down on the carrier, peeling off the support substrate at the separation layer, to expose a surface of the second rewiring layer away from the stacked first semiconductor chip and second semiconductor chip;

providing a plurality of functional chips on said exposed surface of the second rewiring layer, and electrically connecting the plurality of functional chips to the second metal wire layer, forming a second filler layer in a gap between the plurality of functional chips and the second rewiring layer, forming a second encapsulating layer on the surface of the second rewiring layer away from the stacked first semiconductor chip and second semiconductor chip, wherein the second encapsulating layer encapsulates the plurality of functional chips; and removing the carrier.

2. The method according to claim 1, wherein the support substrate is selected from a glass substrate, a metal substrate, a semiconductor substrate, a polymer substrate, and a ceramic substrate; the carrier is selected from a glass substrate, a metal substrate, a semiconductor substrate, a polymer substrate, and a ceramic substrate; wherein the separation layer is selected from a tape layer or polymer layer, and wherein the separation layer is applied to a surface of the support substrate by a spin coating process, and then the separation layer is cured into a solid film using a laser curing, UV curing, or thermal curing process.

3. The method according to claim 1, wherein the forming of the first rewiring layer and the second rewiring layer comprises:

forming a first dielectric layer and a second dielectric layer using a chemical vapor deposition process or a physical vapor deposition process, etching the first deposited dielectric layer to form a patterned first dielectric layer, and etching the second deposited dielectric layer to form a patterned second dielectric layer; and forming a first metal layer on a top surface of the first dielectric layer and a second metal layer on a top surface of the second dielectric layer using a chemical vapor deposition process, a physical vapor deposition process, an evaporation plating process, a sputtering process, an electroplating process or a chemical plating process, etching the first metal layer to form the first metal wire layer, etching the second metal layer to form the second metal wire layer, and electrically connecting the first metal wire layer to the second metal wire layer through the plurality of metal connection pillars.

* * * * *